United States Patent
Schneider et al.

(10) Patent No.: US 9,016,292 B1
(45) Date of Patent: Apr. 28, 2015

(54) SYSTEM AND METHOD FOR CLEANING AND COOLING SOLAR PANELS

(75) Inventors: Matthew N. Schneider, Los Angeles, CA (US); Ravi P. Jain, Austin, TX (US); Jason Alderman, Duarte, CA (US); Michael K. Goodman, Irvine, CA (US)

(73) Assignee: First Solar, Inc, Perrysburg, OH (US)

( * ) Notice: Subject to any disclaimer, the term of this patent is extended or adjusted under 35 U.S.C. 154(b) by 1243 days.

(21) Appl. No.: 12/792,726

(22) Filed: Jun. 2, 2010

Related U.S. Application Data

(60) Provisional application No. 61/217,574, filed on Jun. 2, 2009.

(51) Int. Cl.
    *H01L 31/052* (2014.01)
    *F24J 2/30* (2006.01)

(52) U.S. Cl.
    CPC ............... *F24J 2/30* (2013.01); *H01L 31/0521* (2013.01)

(58) Field of Classification Search
    None
    See application file for complete search history.

(56) References Cited

U.S. PATENT DOCUMENTS

| | | | |
|---|---|---|---|
| 4,119,863 A | 10/1978 | Kelly | |
| 4,297,990 A * | 11/1981 | Allisbaugh | 126/667 |
| 4,432,341 A * | 2/1984 | Howe et al. | 126/623 |
| 5,191,875 A * | 3/1993 | Edling et al. | 126/576 |
| 2002/0066473 A1 | 6/2002 | Levy et al. | |
| 2004/0025931 A1* | 2/2004 | Aguglia | 136/246 |
| 2004/0055632 A1* | 3/2004 | Mazumder et al. | 136/244 |
| 2006/0151022 A1 | 7/2006 | Lawheed | |
| 2007/0204860 A1 | 9/2007 | Rose | |
| 2007/0240278 A1 | 10/2007 | MacDonald | |
| 2007/0295382 A1 | 12/2007 | Oak | |
| 2008/0163864 A1* | 7/2008 | Larson | 126/694 |
| 2009/0038672 A1 | 2/2009 | Conger | |
| 2009/0223510 A1 | 9/2009 | Larsen | |
| 2009/0241994 A1 | 10/2009 | Lee | |
| 2009/0266353 A1 | 10/2009 | Lee | |
| 2009/0288679 A1 | 11/2009 | Pietsch et al. | |
| 2009/0288691 A1 | 11/2009 | Hunt et al. | |
| 2010/0000570 A1 | 1/2010 | Mertins et al. | |

* cited by examiner

*Primary Examiner* — Nicole Blan
*Assistant Examiner* — Ryan Coleman
(74) *Attorney, Agent, or Firm* — Dickstein Shapiro LLP

(57) ABSTRACT

A system and method for cleaning and cooling solar panels are described. A solar tracker includes a main beam for supporting the solar panels, and nozzles coupled to the main beam. The main beam includes a water channel along its interior which supplies water to the nozzles. The nozzles are positioned to spray water on the collecting surfaces of the solar panels to clean and cool them. The solar tracker may also include gutters to reclaim used water. The solar tracker may include air ducts which direct air across the undersides of the solar panels to cool them.

15 Claims, 24 Drawing Sheets

SYSTEM AND METHOD FOR CLEANING AND COOLING SOLAR PANELS

BACKGROUND

Solar panels naturally gather dirt and other contaminants on their collecting surfaces as a result of being installed outdoors. These contaminants block sunlight that would otherwise be used by the panel to produce electricity. In order to optimize solar panel electricity production, it is advantageous to periodically clean the surface of the panel.

Currently, solar panels are cleaned either manually or using a separate cleaning system that is attached to the tracker structure. Manually cleaning panels (i.e., using service personnel to clean the panels) is troublesome and expensive. For example, solar installs may be in remote areas making them difficult to travel to, cleaning may not be required on a regular basis making personnel planning and utilization difficult, and a large number of personnel may be required if the solar installation includes a large number of trackers. External cleaning systems where some sort of autonomous cleaning robot or system is added to the tracker can be expensive as well, because it requires installation, labor, and materials in addition to the tracker itself.

Also, solar panels produce less electricity as they get hotter. Actively cooling solar panels would improve their efficiency. Again, current solutions require the installation of a separate, additional cooling system, which adds cost in terms of installation, labor, and materials.

What is needed is a way to clean solar panels that minimizes or reduces the amount of labor and additional materials or components required. What is needed is a way to clean solar panels automatically.

What is needed is a way of actively cooling solar panels that minimizes or reduces labor and additional materials or components required.

SUMMARY

A solar tracker for supporting a solar panel and tracking the sun is described. The solar tracker comprises a main beam for supporting the solar panel. The main beam defines a liquid channel for carrying a liquid along an interior of the main beam. The main beam also has a liquid port for providing access to the liquid channel. The solar tracker also comprises a liquid supply coupled to the liquid port. The liquid supply supplies liquid to the liquid channel. The solar tracker also comprises a nozzle coupled to the main beam in fluid communication with the liquid channel. The nozzle is configured to spray the liquid on a collecting surface of the solar panel to clean and cool the solar panel.

DETAILED DESCRIPTION OF PREFERRED EMBODIMENTS

Figure 1A:
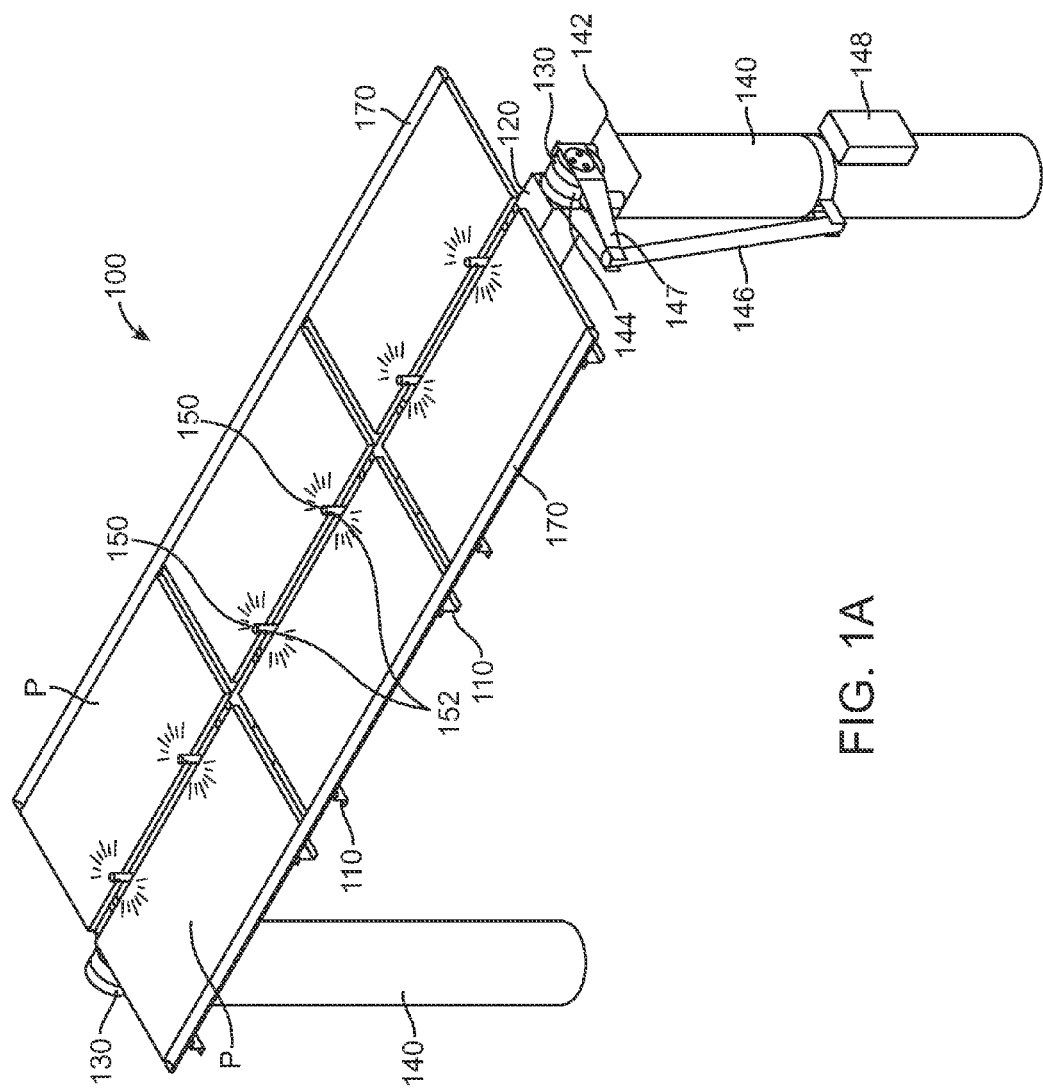
FIGS. 1A-1H, 1J-1N, and 1P-1Q show solar tracker 100 with a main beam 120 having a cross section.
Figure 1B:
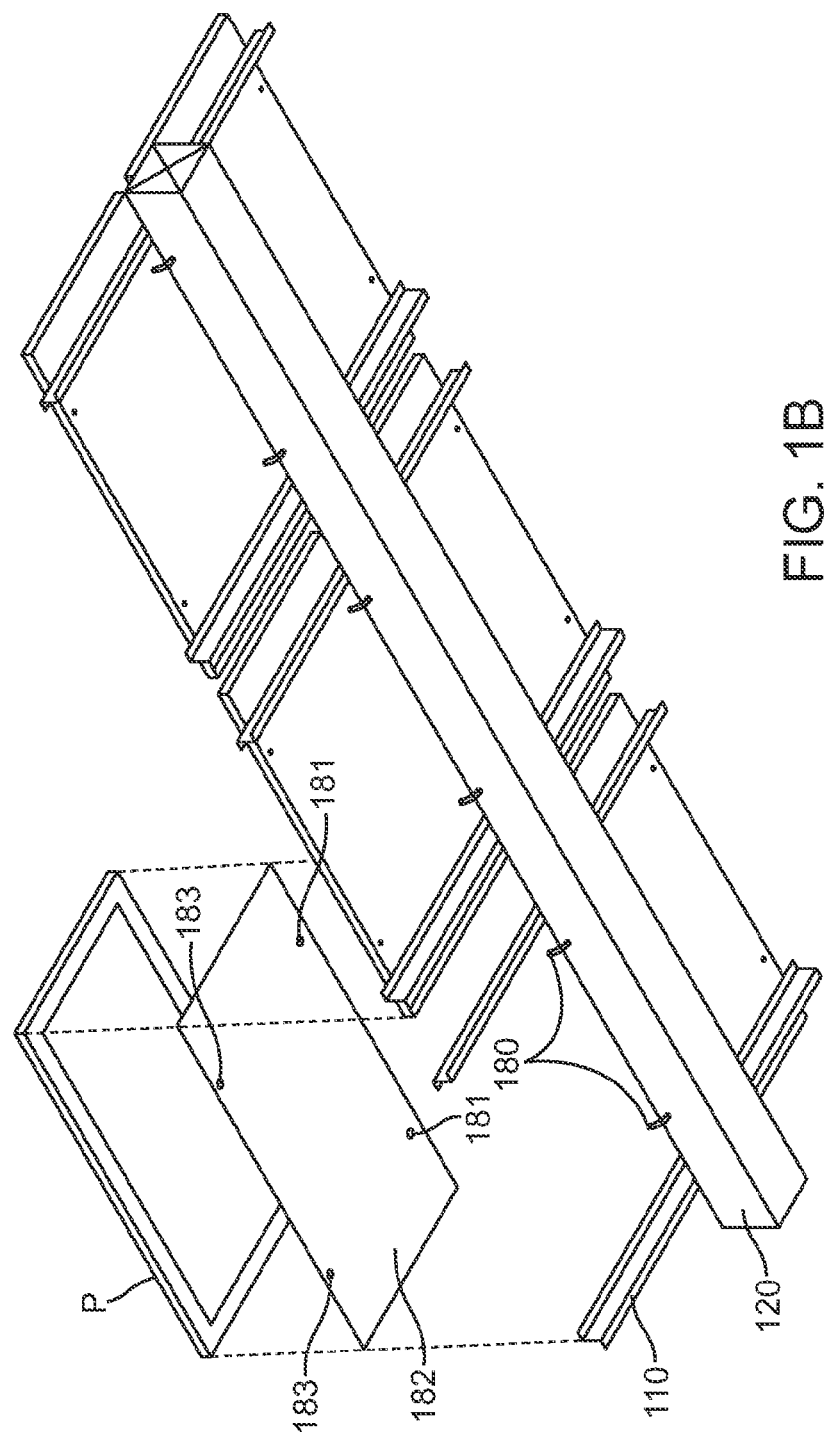
Figure 1C:
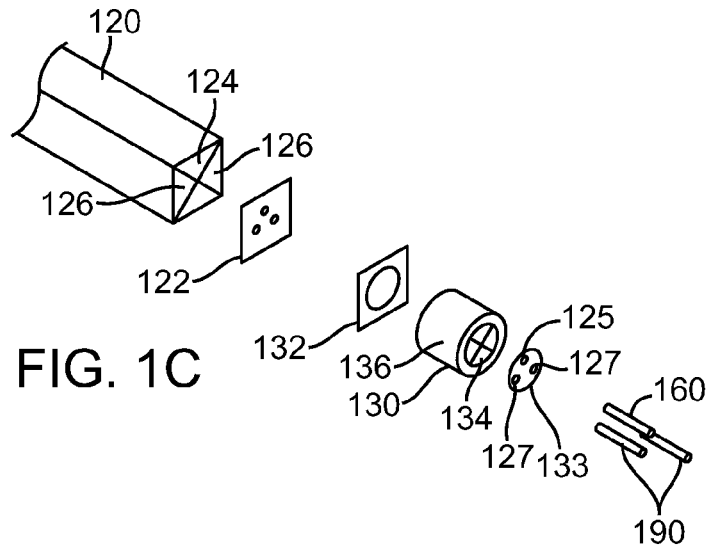
Figure 1D:
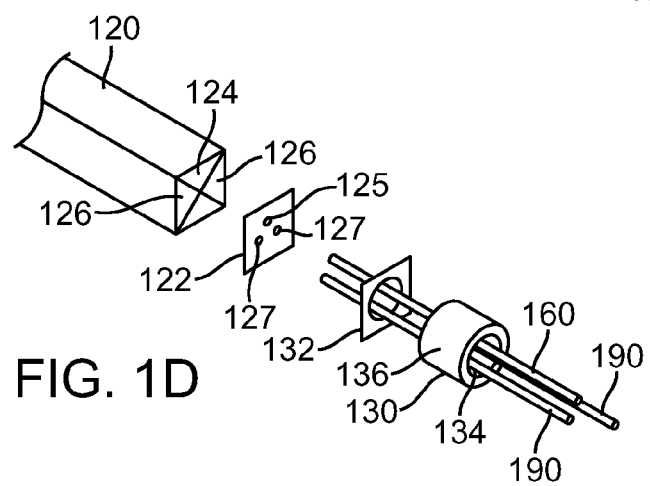
Figure 1E:
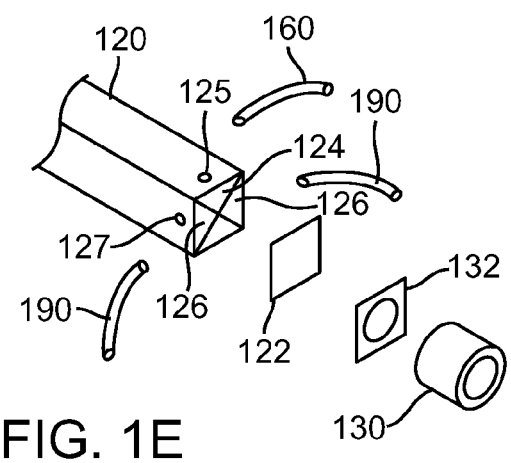
Figure 1F:
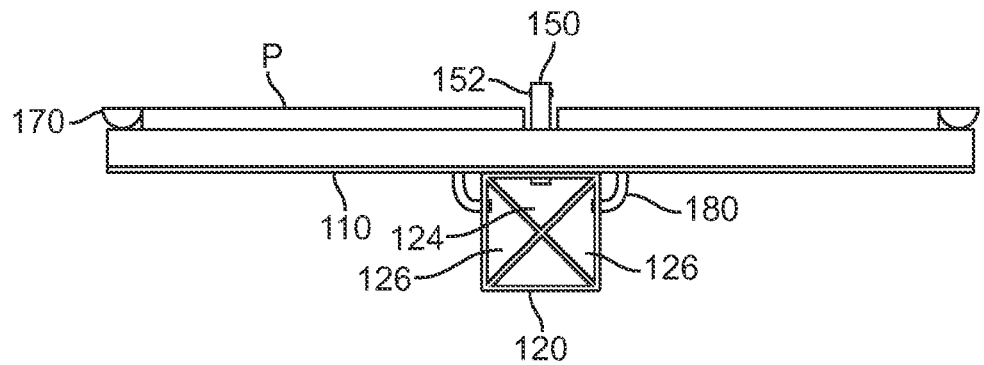
Figure 1G:
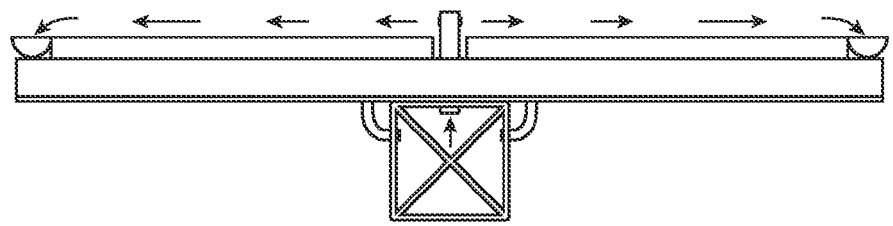
Figure 1H:
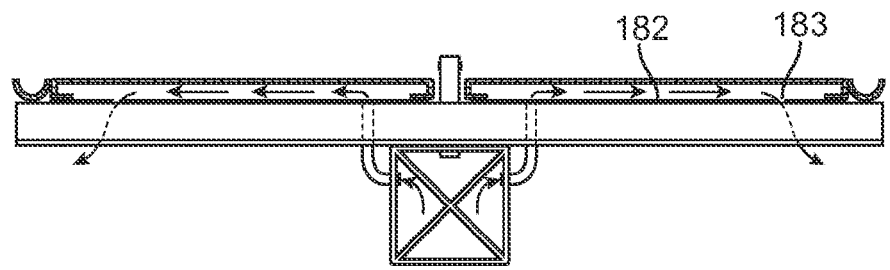
Figure 1J:
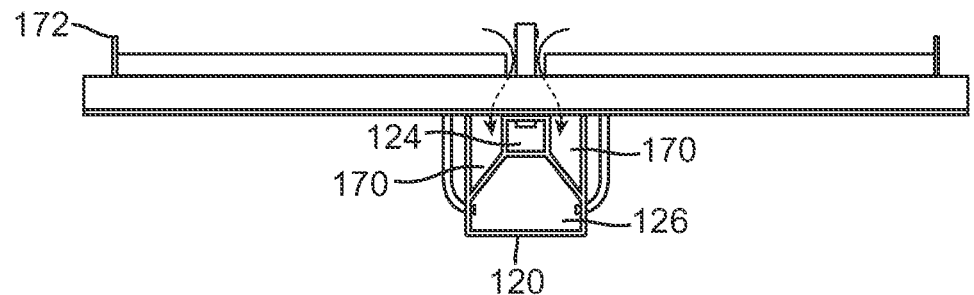
Figure 1K:
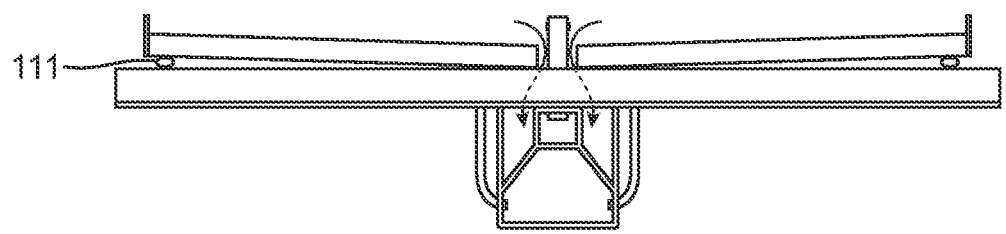
Figure 1L:
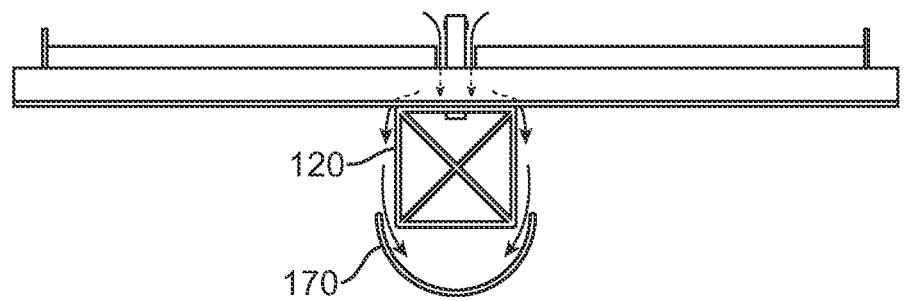
Figure 1M:
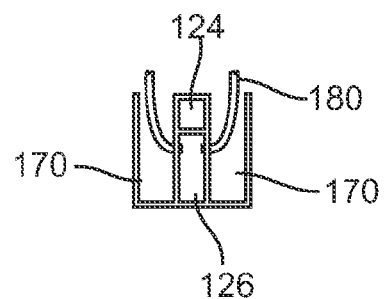
Figure 1N:
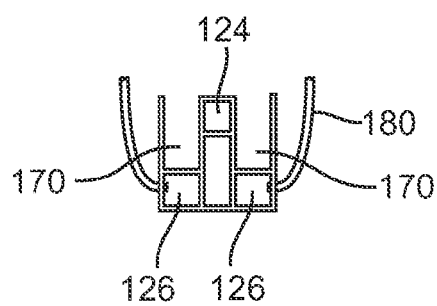
Figure 1P:
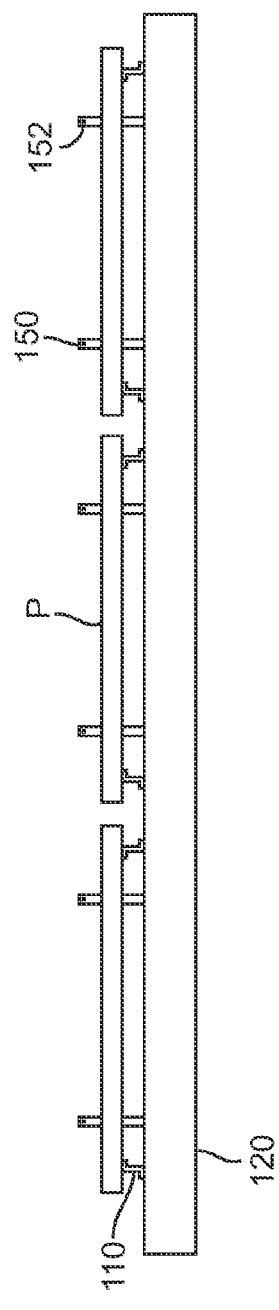

FIGS. 1A, 1F, and 1P show top, end, and side views of one embodiment of a solar tracker 100. Solar tracker 100 provides support to solar panels P, and tilts them to track the sun. Solar tracker 100 includes brackets 110, a main beam 120, bearings 130, and posts 140.

Brackets 110 are coupled to solar panels P, and provide support to solar panels P. Brackets 110 may be coupled to solar panels P by bolts or in any other suitable manner. Brackets 110 may be Z-channels, C-channels, hat channels, or any other suitable elongate support members.

Main beam 120 is coupled to brackets 110, and provides support to brackets 110. Main beam 120 may be coupled to brackets 110 by U-bolts or in any other suitable manner. A main beam flange 122 is coupled to each end of main beam 120.

A bearing 130 is coupled to each end of main beam 120, and allow main beam 120 to rotate. A bearing flange 132 is fixedly coupled to an inner race 134 of bearing 130. Bearing flange 132 is configured to be coupled to main beam flange 122.

A post 140 is coupled to bearing 130, and supports bearing 130. Post 140 includes at its top a platform 142 which supports a bearing mount 144. Bearing mount 144 is fixedly coupled to an outer race 136 of bearing 130. An actuator 146 is coupled to post 140 and an actuator arm 147. Actuator arm 147 is coupled to bearing flange 132. A control system 148 is coupled to and controls actuator 146 to track the sun, and may provide other functions. Control system 148 is also electrically coupled to solar panels P.

As shown in FIGS. 1A, 1F, and 1P, solar tracker 100 may include spray heads 150 coupled to main beam 120 for cleaning and cooling the collecting surfaces of solar panels P. Spray heads 150 include any number of nozzles 152 positioned to spray water on the collecting surfaces of solar panels P.

To supply spray heads 150, main beam 120 may include at least one water channel 124 along its interior. Spray heads 150 are coupled to main beam 120 in fluid communication with water channel 124. Spray heads 150 may be coupled to main beam 120 by threaded fittings, press fit, or other suitable manner.

A water supply 160 supplies water to water channel 124 and spray heads 150. A water port 125 provides access to water channel 124. Water supply 160 may be a hose or pipe coupled to water port 125. Water supply 160 may be controlled by a solenoid valve coupled to control system 148.

FIG. 1C shows an exploded view of an end of main beam 120 and bearing 130. Water port 125 may be formed in an inner race cap 133 which covers inner race 134. Water passes through water supply 160, water port 125, inner race 134, a hole in main beam flange 122, and water channel 124. The water continues through spray heads 150, out of nozzles 152, and onto the collecting surfaces of solar panels P.

Alternatively, as shown in FIG. 1D, water port 125 may be formed in main beam flange 122, and accessed through inner race 134. Alternatively, as shown in FIG. 1E, water port 125 may be formed directly in main beam 120. Water ports 125 of multiple main beams 120 may be fluidly coupled to share a common water supply 160.

Control system 148 may include different programs for cleaning solar panels P. For example, control system 148 may tilt solar panels P before they are sprayed. Nozzles 152 may be configured to spray only when solar panels P are "downhill" of spray heads 150. Nozzles 152 then wash solar panels P on one side of main beam 120 at a time. Alternatively, control system 148 may position solar panels P horizontally before they are sprayed. The water may be allowed to sit for a while. Control system 148 may "agitate" solar panels P, or tilt them back and forth, to move the water around on the collecting surfaces. Control system 148 may then tilt solar panels P enough to drain the water. Control system 148 may be programmed to initiate cleaning when the output of solar panels P falls below a certain threshold.

In addition to water, or in place of water, any suitable liquid may be used. For example, alcohols, water mixed with vinegar, or water mixed with a water softener may be used. Furthermore, more than one liquid may be used, either in sequence, or through multiple, isolated channels supplying a different set of nozzles 152. For example, a water presoak may be followed by an alcohol final wash. The interiors of the channels may be lined with a polymer, anodized, or plated with a non-reactive metal to prevent corrosion or reaction with the particular liquid used. The water or other fluid may be filtered to remove mineral impurities and dirt that would adversely affect performance of solar panels P. For example, a filter may be integrated in water channel 124. The liquid may be driven by positive pressure or vacuum.

As shown in FIGS. 1A and 1F, solar tracker 100 may include gutters 170 for recapturing used water. Solar tracker 100 with gutters 170 may also be used to collect rain water. Gutters 170 may be positioned at the outside edges of solar panels P. As indicated by the arrows in FIG. 1G, water from nozzles 152 flows across solar panels P toward the outside edges of solar panels P and into gutters 170. Gutters 170 drain into a hose or pipe. Solar panels P may be tilted to help draining.

Alternatively, gutters 170 may be positioned at the center edges of solar panels P. Gutters 170 may be positioned on top of main beam 120, or, as shown in FIG. 1J, formed as part of main beam 120. Main beam 120 may have a variety of cross sections, of which two examples are shown in FIGS. 1M and 1N. Main beam 120 may be extruded, or formed from individual smaller pieces coupled together. As indicated by the arrows, water drains toward the center edges of solar panels P, through a gap between solar panels P, and into gutters 170. As shown in FIG. 1L, a single gutter 170 may be positioned beneath main beam 120. As indicated by the arrows, water drains onto and around main beam 120, and into gutter 170. A lip 172 may be positioned at the outside edges of solar panels P to prevent water from flowing off. Solar panels P may be tilted to help draining.

Figure 1Q:
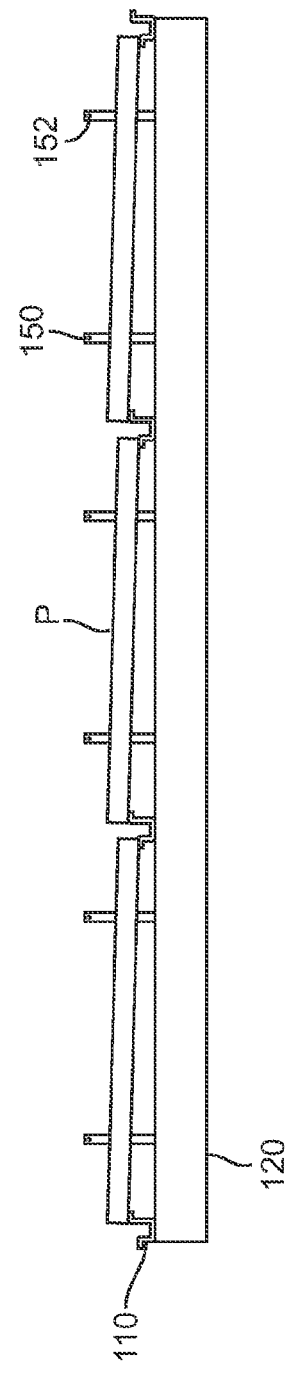

To help water drain, solar panels P may be mounted at an angle. As shown in FIG. 1K, solar panels P may be coupled to brackets 110 at an angle toward main beam 120 to help draining. A spacer 111 may be used between bracket 110 and solar panel P to create this angle. FIG. 1P shows a side view of solar tracker 100. Bearings 130, posts 140, and other elements already described are not shown for clarity. As shown in FIG. 1Q, solar panels P may be coupled to brackets 110 at an angle toward one end of main beam 120 to help draining. Brackets 110 may be positioned to act as intermediary gutters which feed into gutters 170. Brackets 110 are shown as J-channels with flanges, but may also be hat channels (used with spacers to create an angle), Z-channels with return flanges, or any other suitable configuration. Brackets 110 may be of different sizes and cross sections. The configurations shown in FIGS. 1K and 1Q are well-suited for use with a fixed, non-rotating main beam 120. However, any of the other solar trackers described may also be used with a fixed, non-rotating main beam 120, essentially as a fixed rack.

FIG. 1B shows a bottom view of solar tracker 100. Bearings 130, posts 140, and other elements already described are not shown for clarity. As shown in FIGS. 1B and 1F, solar tracker 100 may include air ducts 180 for cooling the undersides of solar panels P. Air ducts 180 direct air along the undersides of solar panels P. Air ducts 180 may work in conjunction with shrouds 182 coupled to the undersides of solar panels P. Shrouds 182 and solar panel P create a substantially enclosed air passage and may enhance the cooling effect of air from air ducts 180. Shrouds 182 include air inlets 181 and air outlets 183. Shrouds 182 may be made of metal, plastic, polyester film, chemical-resistant PVC (Type I), high and low density polyethylene (HDPE, LDPE), DuPont™ Tyvek®, or any other suitable material.

To supply air ducts 180, main beam 120 may include one or more air channels 126 along its interior. Air ducts 180 are coupled to main beam 120 in fluid communication with air channels 126. Air ducts 180 are also coupled to air inlets 181.

An air supply 190 supplies air to air channels 126 and air ducts 180. Air ports 127 provide access to air channels 126. Air supply 190 may be a hose or pipe coupled to air ports 127. Air supply 190 may be controlled by a solenoid valve coupled to control system 148. Control system 148 may be programmed to initiate cooling when the output of solar panels P falls below a certain threshold.

As shown in FIG. 1C, air ports 127 may be formed in inner race cap 133. Air passes through air supply 190, air port 127, inner race 134, a hole in main beam flange 122, and air channel 126. Inner race 134 may have partitions to prevent mixing of air and water.

Alternatively, as shown in FIG. 1D, air ports 127 may be formed in main beam flange 122, and accessed through inner race 134. Alternatively, as shown in FIG. 1E, air ports 127 may be formed directly in main beam 120. Air ports 127 of multiple main beams 120 may be fluidly coupled to share a common air supply 190. Water ports 125 and air ports 127 may be located at the same, opposite, or both ends of main beam 120.

As indicated by the arrows in the partial cross-section view in FIG. 1H, air passes through air ducts 180, air inlets 181, the air passage between shrouds 182 and solar panels P, and air outlets 183. The air may be driven by a fan, a vacuum, a pump, or any other suitable device. In the case where vacuum is used instead of positive pressure, ambient air would travel "backwards" and be drawn in through air outlets 183 into the air passage between shrouds 182 and solar panels P. The air would then pass through air inlets 181, air ducts 180, air channel 126, air port 127, and air supply 190. Such a vacuum may be provided by a chimney effect, where main beam 120 is angled and hot air inside air channels 126 rises to draw ambient air through air outlets 183. The air channels 126 of multiple main beams 120 may be fluidly coupled to enhance the chimney effect. In addition to air, or in place of air, any suitable fluid may be used. For example, nitrogen or water vapor may be used.

Figure 2A:
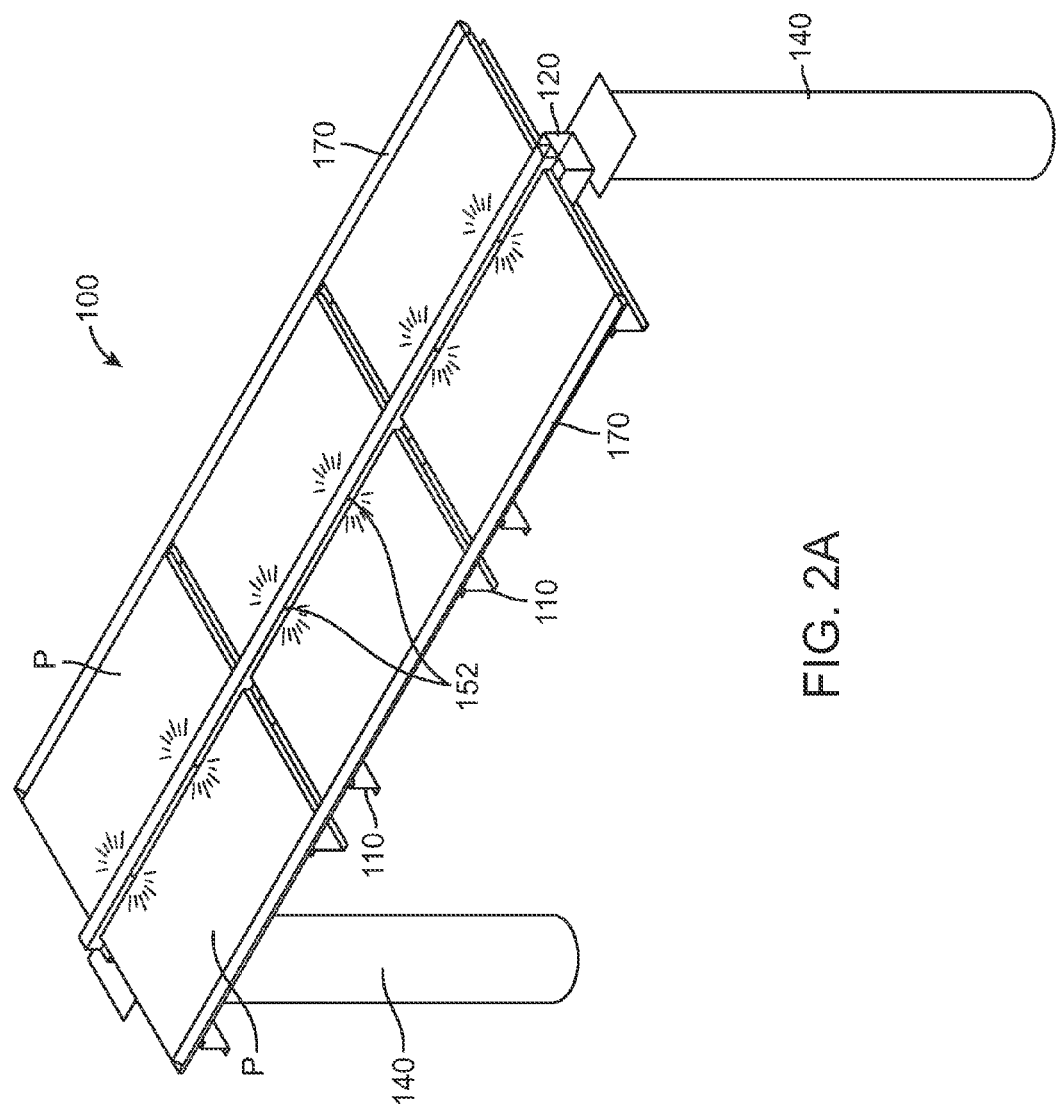
FIGS. 2A-2G show solar tracker 100 with a main beam 120 having another cross section.
Figure 2B:
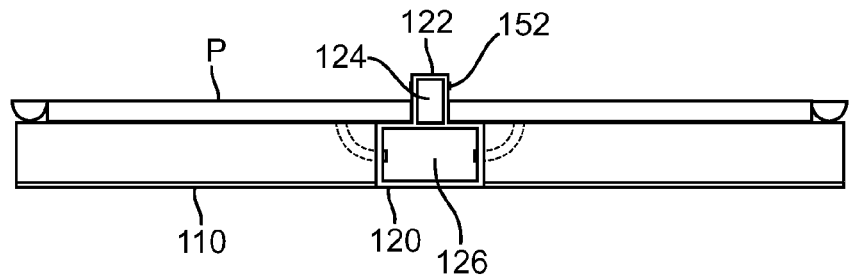
Figure 2C:
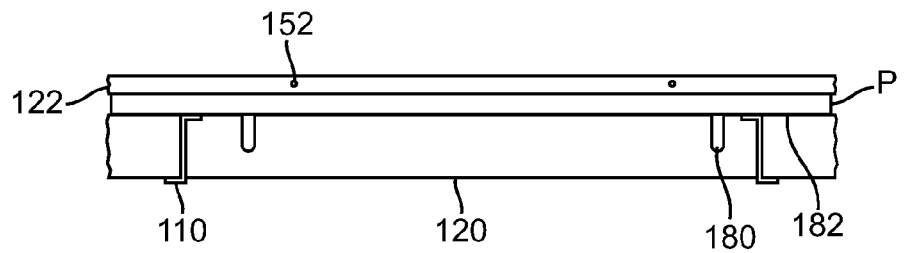
Figure 2D:
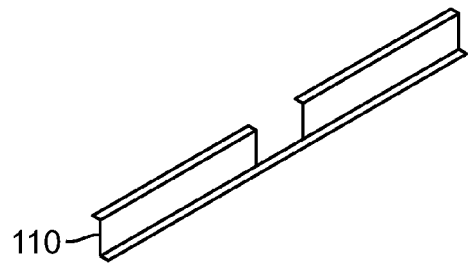
Figure 2E:
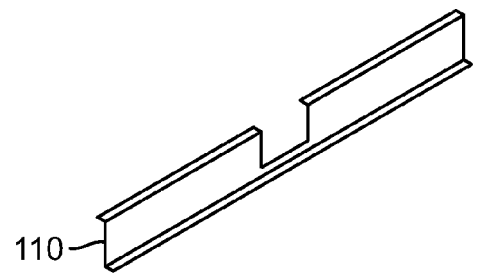

FIGS. 2A-2C show top, end, and partial side views of solar tracker 100 with a main beam 120 having another cross section. Bearings 130 and other elements already described are not shown for clarity. Main beam 120 has a rectangular cross section, with a nozzle portion 122 having a smaller, rectangular cross section. As shown in FIG. 2D, brackets 110 have a portion cut away to accommodate main beam 120. A variation of brackets 110 is shown in FIG. 2E.

Nozzle portion 122 includes nozzles 152 positioned to spray water on the collecting surfaces of solar panels P. To supply nozzles 152, main beam 120 includes a water channel 124 formed along an interior of nozzle portion 122. Nozzles 152 are coupled in the sides of nozzle portion 122 and in fluid communication with water channel 124. Alternatively, nozzles 152 may be positioned on the top of nozzle portion 122.

Solar tracker 100 may include air ducts 180 that couple air channel 126 to air inlets 181. Alternatively, air inlets 181 may be positioned to couple directly to holes formed in main beam in fluid communication with air channel 126, eliminating the need for air ducts 180.

Figure 2F:
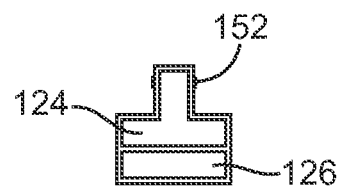
Figure 2G:
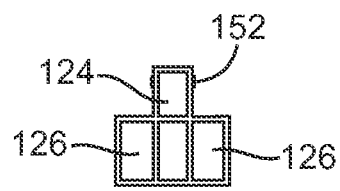

Main beam 120 may have any one of a variety of cross sections, some examples of which are shown in FIGS. 2F-2G. One strategy is to minimize the size of water channel 124 without introducing substantial drag. Another consideration is retaining compatibility with the port pattern in a given main beam flange 122.

Figure 3A:
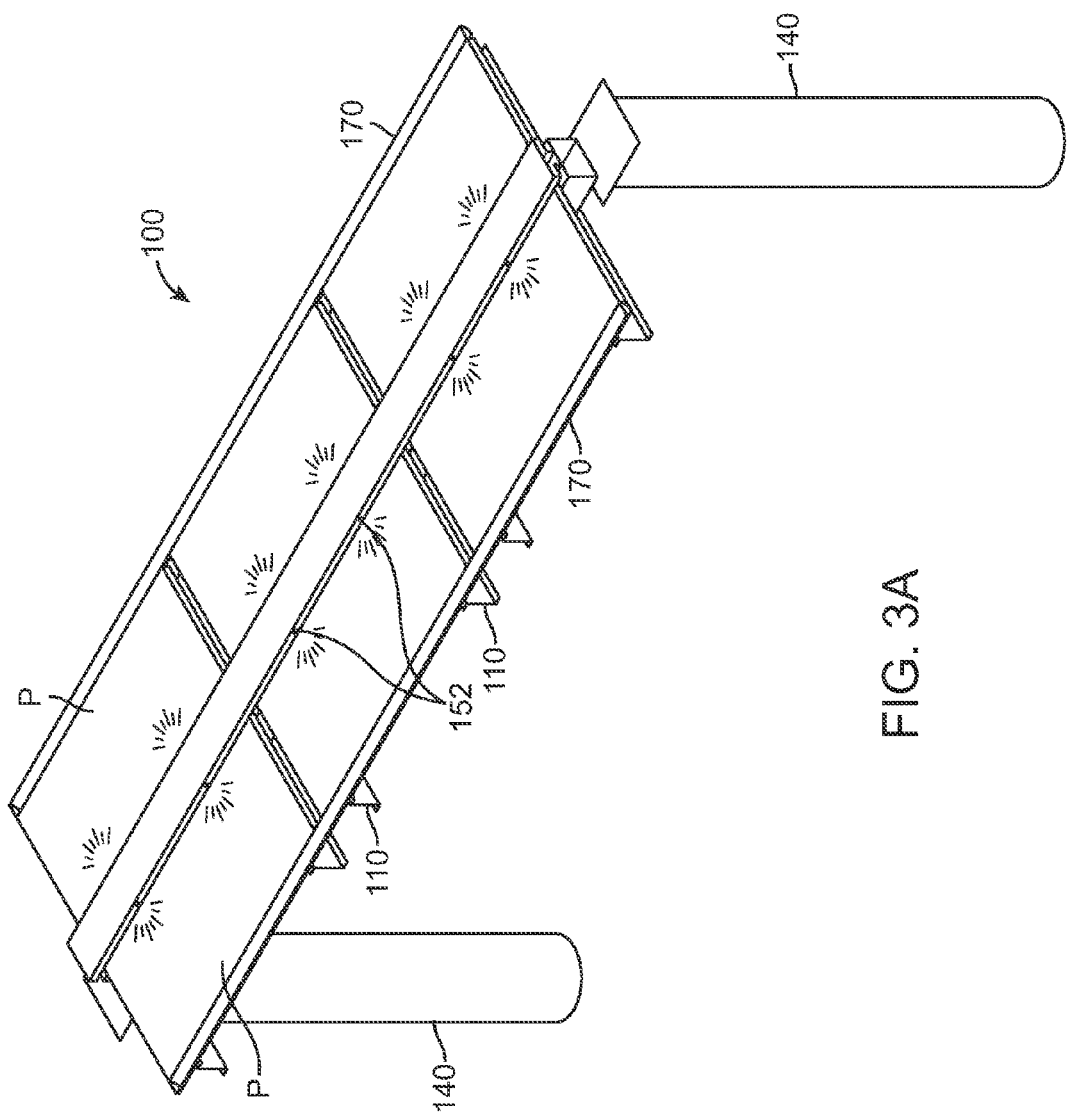
FIGS. 3A-3F show solar tracker 100 with a main beam 120 having yet another cross section.
Figure 3B:
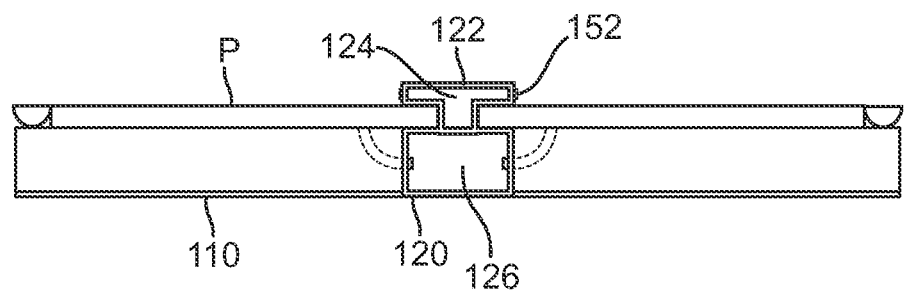
Figure 3C:
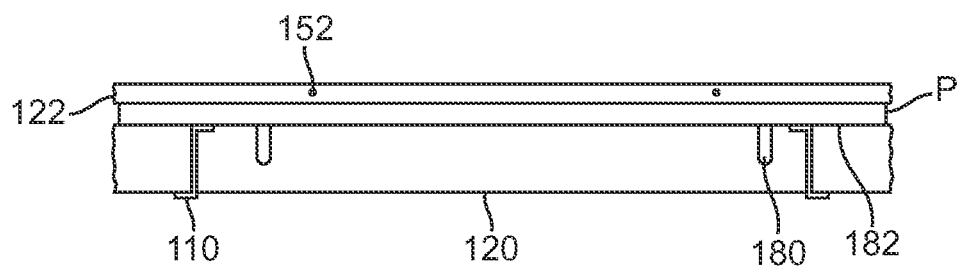
Figure 3D:
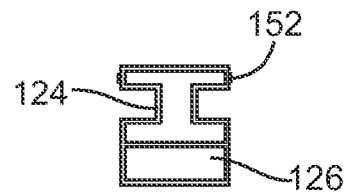
Figure 3E:
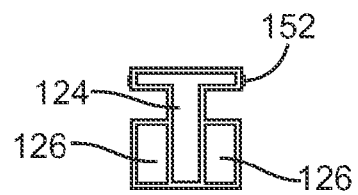
Figure 3F:
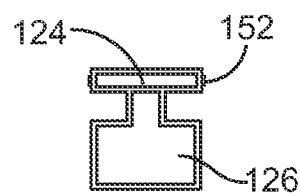
Figure 4A:
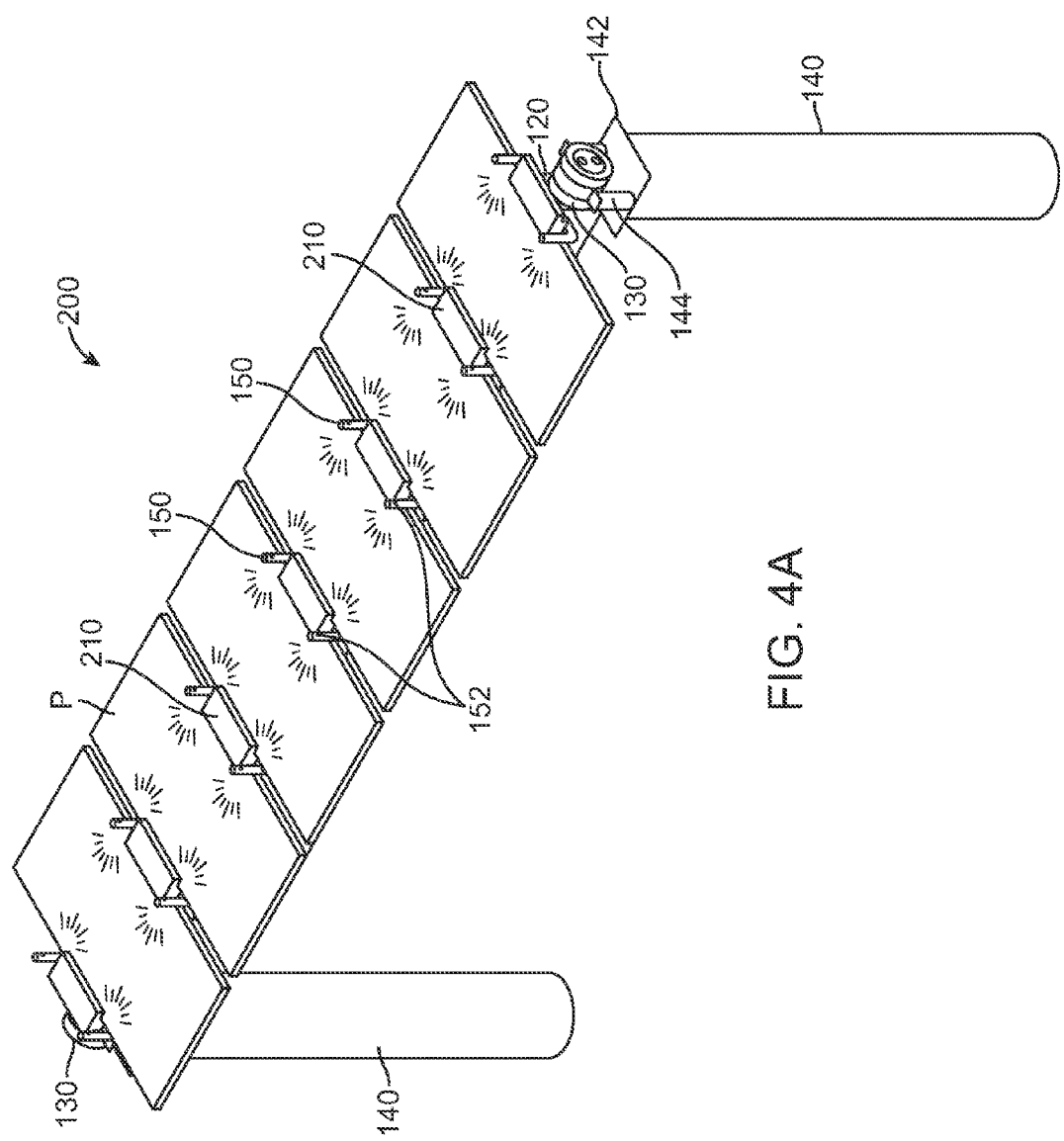
FIGS. 4A-4D show solar tracker 200 with clamps 210.
Figure 4B:
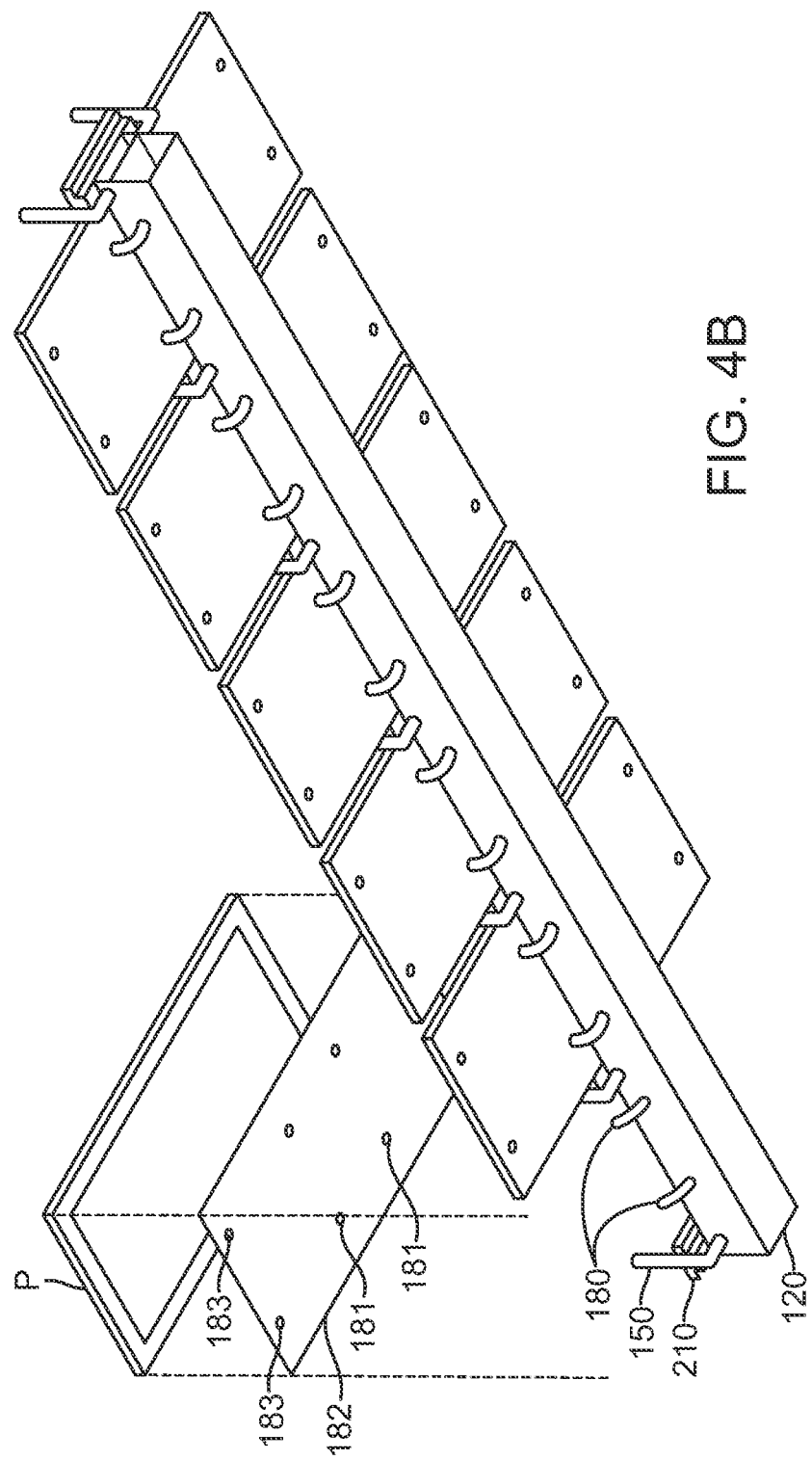
Figure 4C:
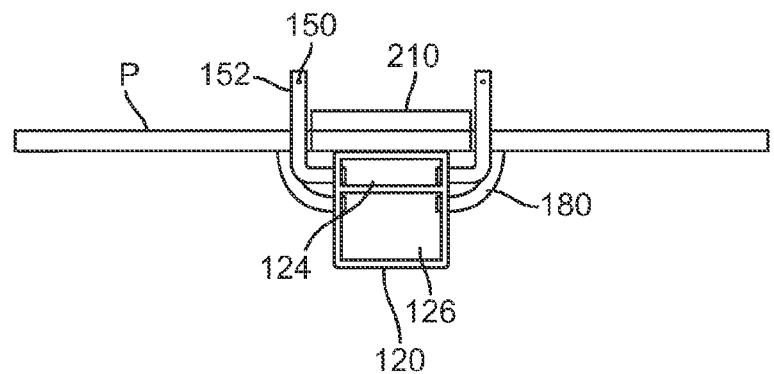
Figure 4D:
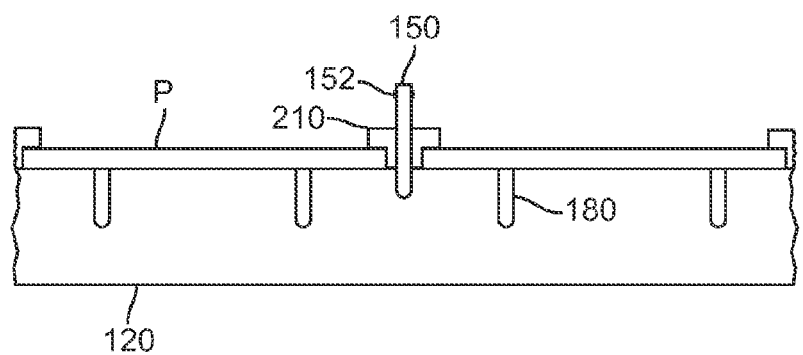

FIGS. 3A-3C show top, end, and partial side views of solar tracker 100 with a main beam 120 having yet another cross section. Bearings 130 and other elements already described are not shown for clarity. Main beam 120 has a rectangular cross section, with a nozzle portion 122 having a T-shaped cross section. Nozzles 152 are coupled in the sides of nozzle portion 122 and in fluid communication with water channel 124. Alternatively, nozzles 152 may be positioned on the top of nozzle portion 122. Main beam 120 may have any one of a variety of internal cross sections, some examples of which are shown in FIGS. 3D-3F.

FIGS. 4A-4D show top, bottom, end, and partial side views of another embodiment of a solar tracker 200. Solar tracker 200 includes clamps 210, a main beam 120, bearings 130, and posts 140.

Solar panels P are supported by main beam 120 and held in place by clamps 210. Clamps 210 fit on top of and in between solar panels P, and are coupled to main beam 120. Clamps 210 may be coupled to main beam 120 by U-bolts or in any other suitable manner. Clamps 210 may have a T-shaped cross section or any other suitable cross section.

Solar tracker 200 may include spray heads 150 coupled to main beam 120 in fluid communication with water channel 124. Spray heads 150 may be positioned in the gaps between solar panels P.

Solar tracker 200 may include air ducts 180 that couple air channel 126 to air inlets 181. Alternatively, air inlets 181 may be positioned to couple directly to holes formed in main beam 120 in fluid communication with air channel 126, eliminating the need for air ducts 180.

Figure 5A:
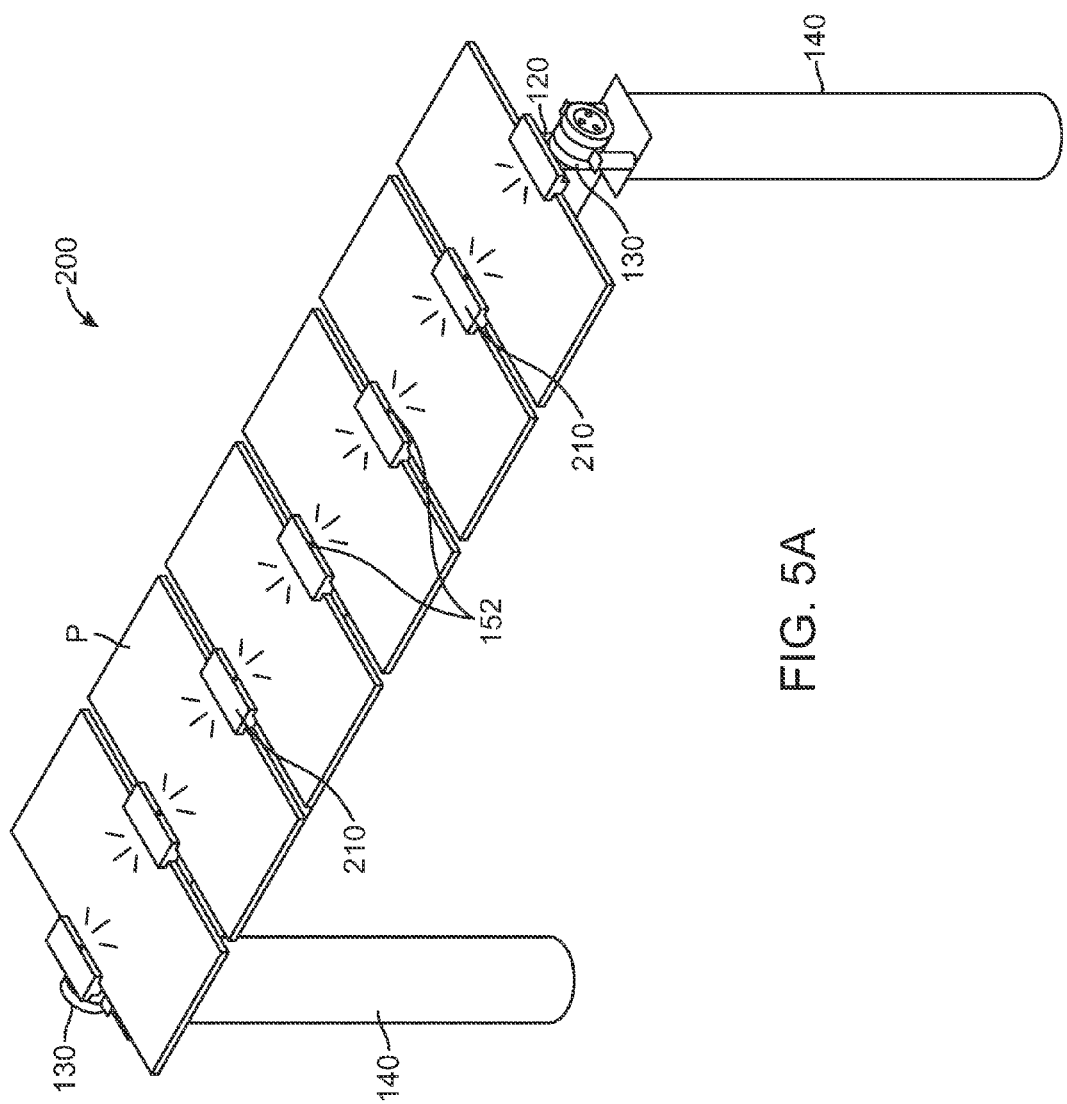
FIGS. 5A-5C show solar tracker 200 with clamps 210 having nozzles 152.
Figure 5B:
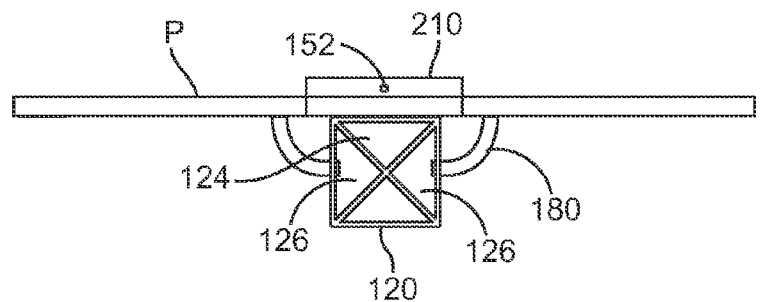
Figure 5C:
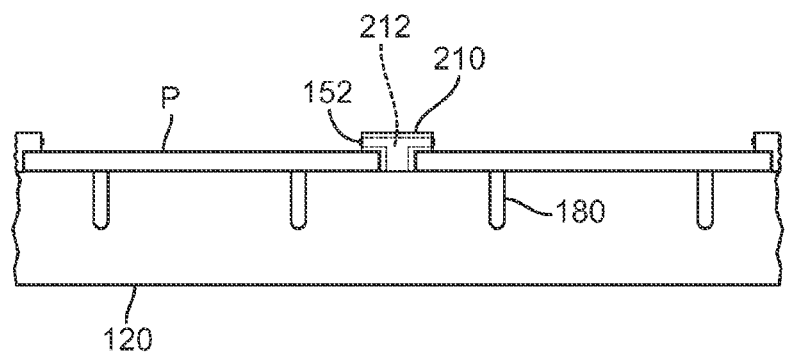

FIGS. 5A-5C show top, end, and partial side views of solar tracker 200 having clamps 210 with any number of nozzles 152. Clamps 210 include water channels 212 coupled in fluid communication with water channel 124 of main beam 120.

Figure 6A:
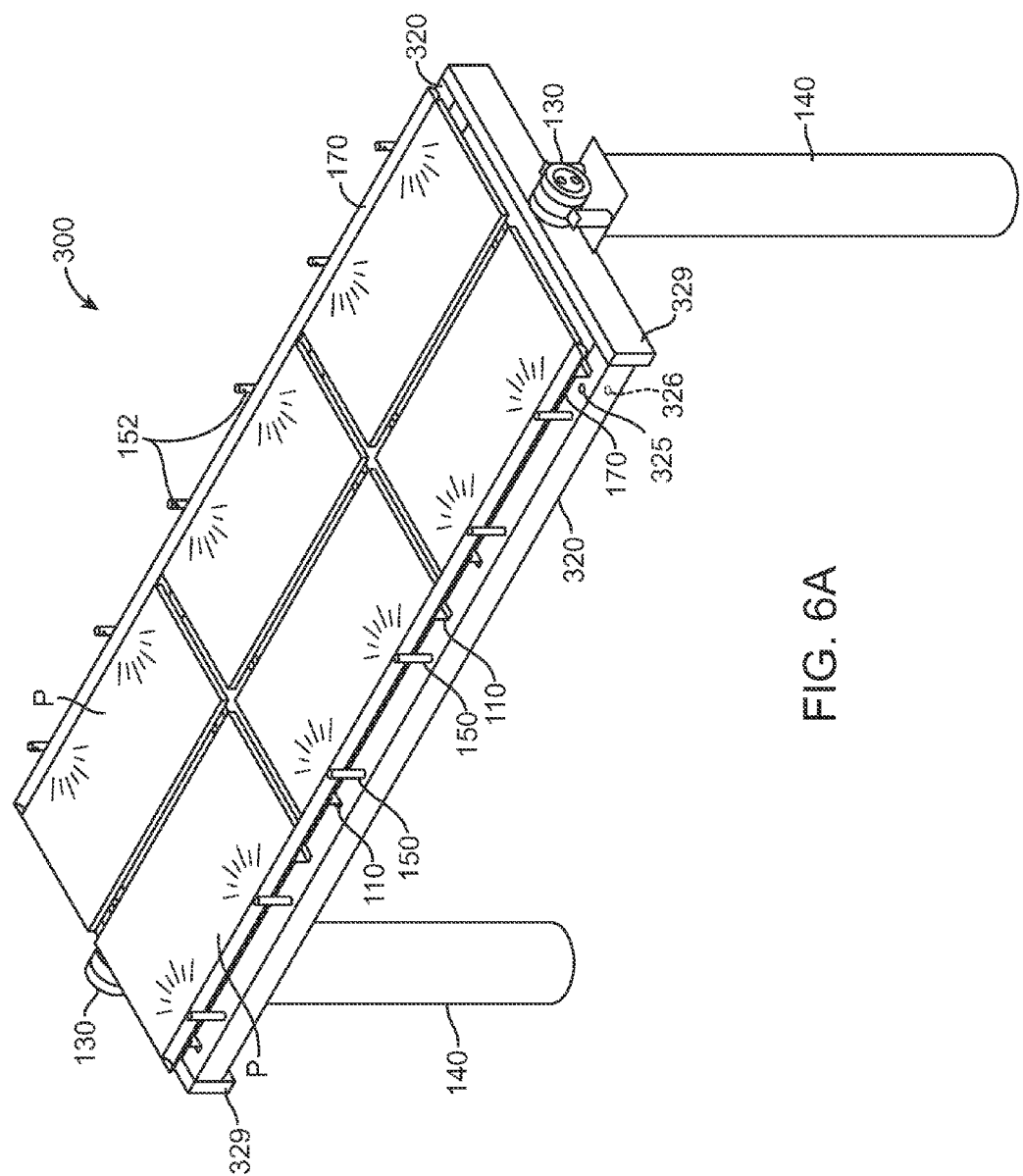
FIGS. 6A-6C show solar tracker 300 with side beams 320 having a cross section.
Figure 6B:
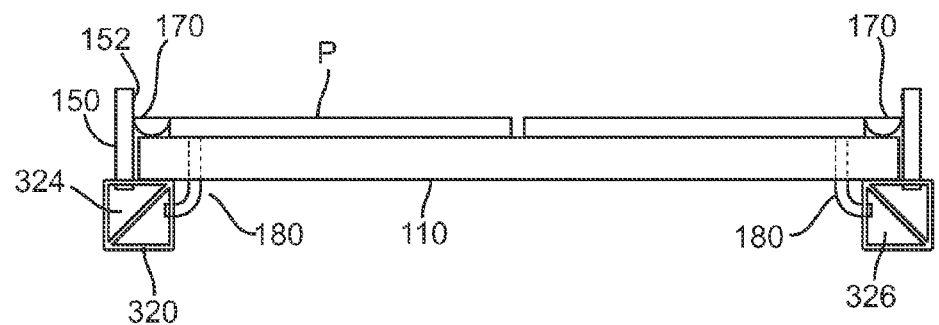

FIGS. 6A-6B show top and end views of yet another embodiment of a solar tracker 300. Solar tracker 300 includes brackets 110, side beams 320, end beams 329, bearings 130, and posts 140. End beams 329, bearings 130, and posts 140 are not shown in FIG. 6B for clarity.

Brackets 110 are coupled to and supported by side beams 320. Side beams 320 may have any one of a variety of cross sections, either mirror images of each other or not. Side beams 320 are coupled at their ends to end beams 325. Bearings 130 are coupled to end beams 329, and allow end beams 329 to rotate.

Solar tracker 300 may include spray heads 150 coupled to one or both side beams 320. To supply spray heads 150, side beams 320 may include one or more water channels 324 along their interiors. Spray heads 150 are coupled to side beams 320 in fluid communication with water channels 324. Side beams 320 include water ports 325 that allow water supplies 160 to access water channels 324. Water ports 325 may be formed directly in side beams 320.

Figure 6C:
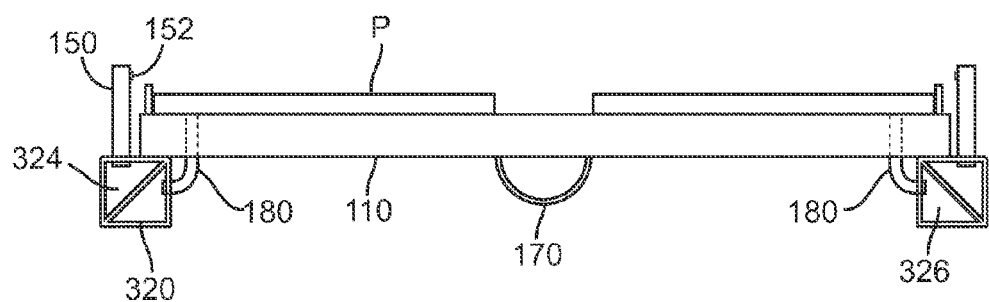

Solar tracker 300 may include gutters 170 positioned at one or both outside edges of solar panels P. Gutters 170 may be formed in side beams 320. Alternatively, as shown in FIG. 6C, a single gutter 170 may be positioned at the center edges of solar panels P. A lip 172 may be positioned at the outside edges of solar panels P to prevent water from flowing off.

Solar tracker 300 may include air ducts 180. To supply air ducts 180, side beams 320 may include one or more air channels 326 along their interiors. Air ducts 180 couple air channels 326 to air inlets 181. Air ports 327 provide access to air channels 326. Air ports 327 may be formed directly in side beams 320.

Figure 7A:
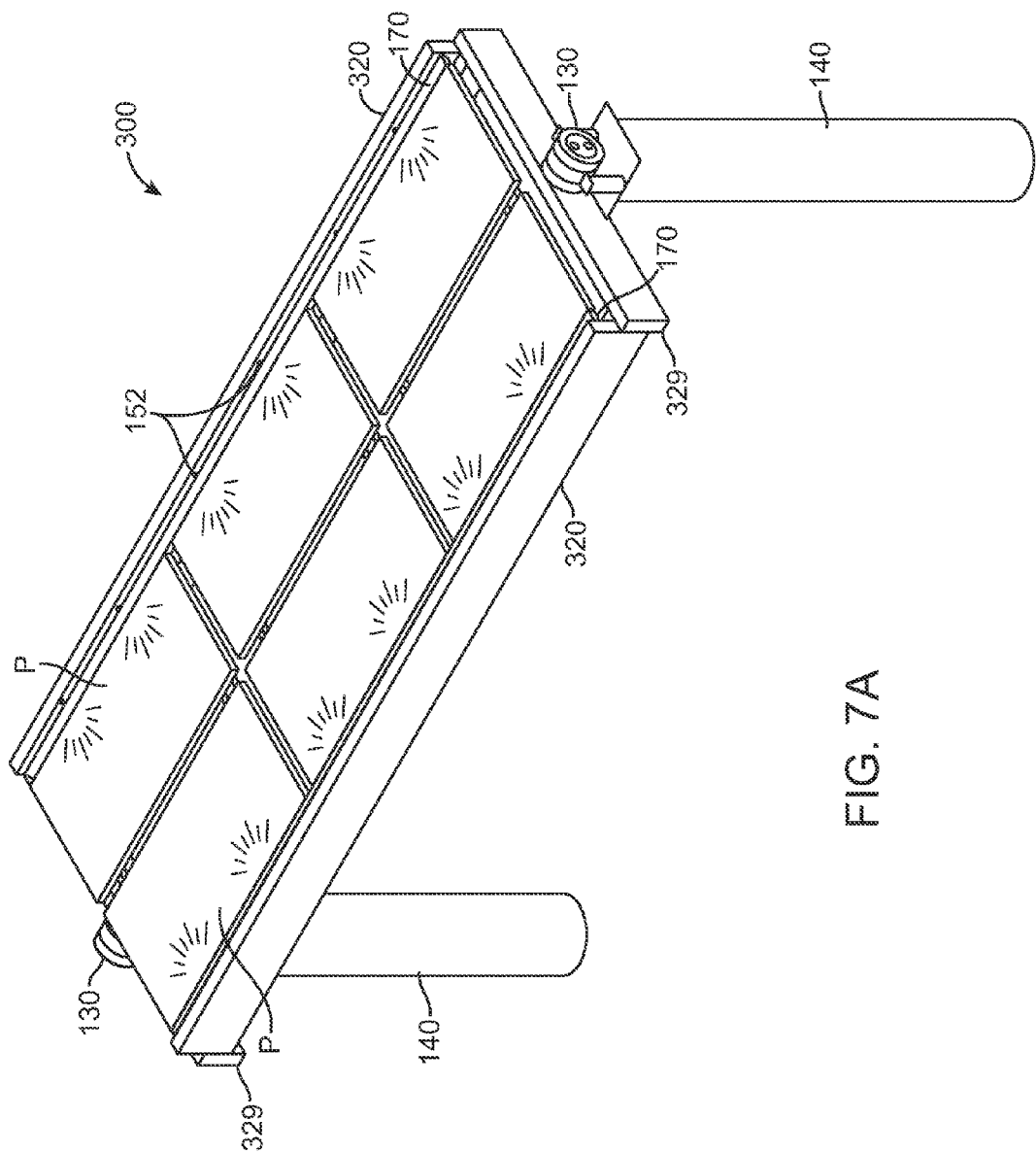
FIGS. 7A-7C show solar tracker 300 with side beams 320 having another cross section.
Figure 7B:
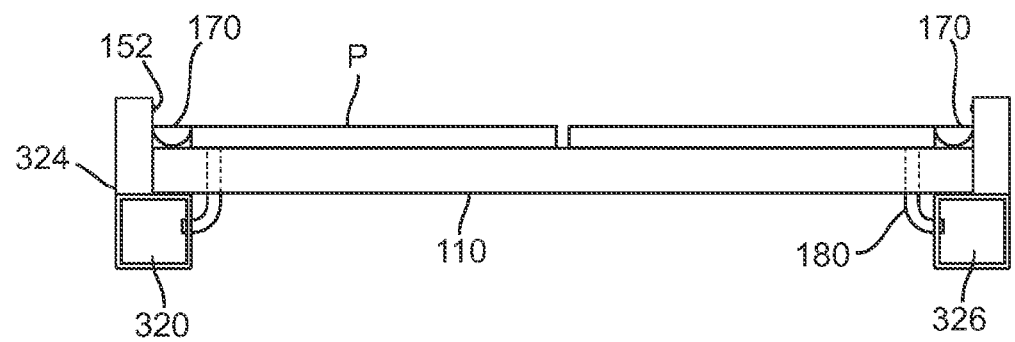
Figure 7C:
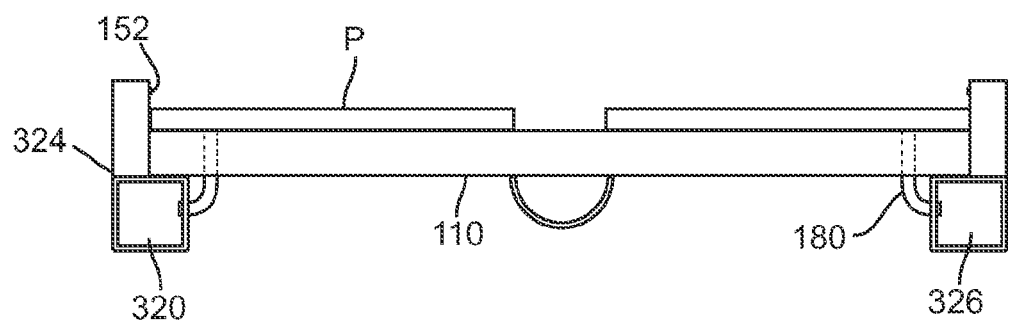

FIG. 7A-7C show top and end views of a solar tracker 300 with side beams 320 having another cross section. End beams 329, bearings 130, and posts 140 are not shown in FIG. 7B for clarity. Side beams 320 have an L-shaped cross section, with nozzle portions 322. Nozzle portions 322 include nozzles 152 positioned to spray water on the collecting surfaces of solar panels P. Nozzles 152 are coupled on the inward-facing sides of nozzle portions 322 in fluid communication with water channels 324. Alternatively, nozzles 152 may be positioned on the tops of nozzle portions 322. Solar tracker 300 may include gutters 170 positioned at one or both outside edges of solar panels P, as shown in FIGS. 7A and 7B, or may include a single gutter 170 positioned at the center edges of solar panels P, as shown in FIG. 7C.

Figure 8A:
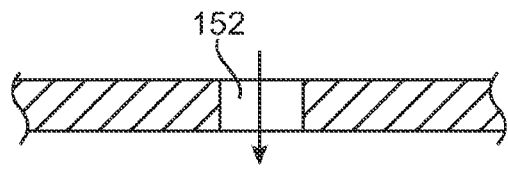
FIGS. 8A-8C show various embodiments of nozzles 152.
Figure 8B:
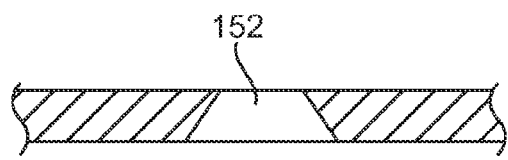
Figure 8C:
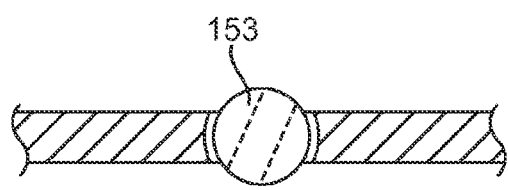

FIGS. 8A-8C show various embodiments of nozzles 152. FIG. 8A shows a nozzle 152 having a uniform width. FIG. 8B shows a nozzle 152 that increases in width. FIG. 8C shows a nozzle 152 that is a rotating hollow ball 153 that can be adjusted and/or replaced.

Nozzles 152 may be circular, polygonal, elliptical, or a combination of straight and curved in shape. Nozzles 152 may be positioned above solar panels P, and spray water down on solar panels P. Alternatively, nozzles 152 may be positioned next to or below solar panels P, and spray up and onto solar panels P. Nozzles 152 may be configured to cover an entire length and/or width of a solar panel P, or only a portion of a solar panel P. Nozzles 152 may be made increasingly larger with distance from water supply 160 to compensate for pressure loss.

Figure 9A:
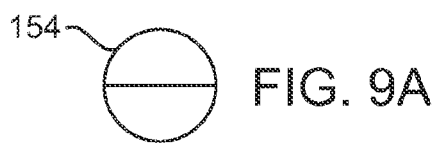
FIGS. 9A-9C show various embodiments of nozzle flaps 154.
Figure 9B:
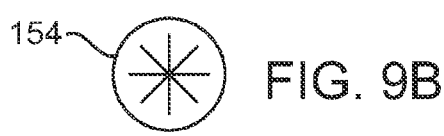
Figure 9C:
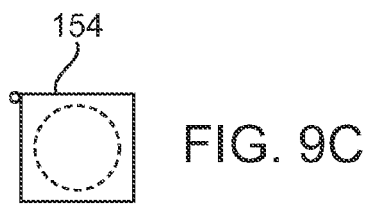

FIGS. 9A-9C show various embodiments of nozzle flaps 154. Nozzle flaps 154 open up when the water pressure is sufficiently high, and protects nozzles 152 from contamination. FIG. 9A shows a nozzle flap 154 that is a membrane with a slit across the middle. FIG. 9B shows a nozzle flap 154 that is a membrane with multiple radial slits. FIG. 9C shows a nozzle flap 154 that is hinged at its top, and is configured to swing open and allow water to flow only when solar panels P are positioned "downhill" of nozzles 152.

Figure 10:
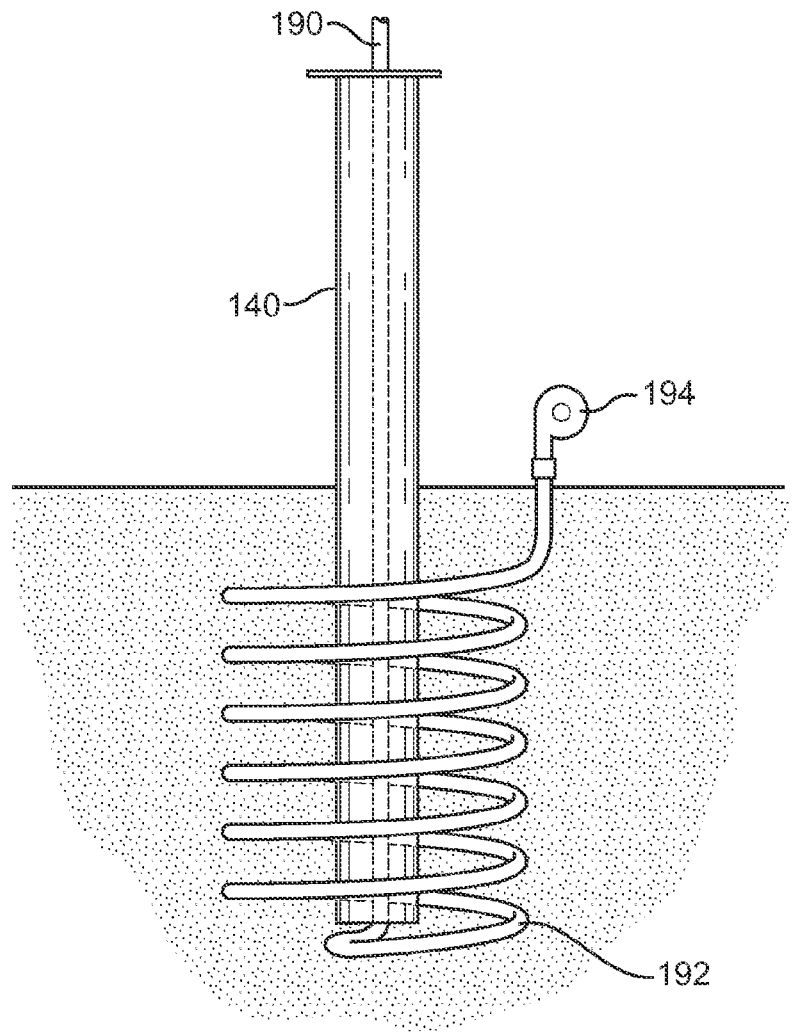
FIG. 10 shows solar tracker 100 with geothermal cooling.

FIG. 10 shows geothermal cooling system for cooling the air. A geothermal coil 192 is coupled to air supply 190, and cools the air before air supply 190 delivers it to air channels 126 or 326. A pump 194 is coupled to and forces air through geothermal coil 192. Air supply 190 may pass through the interior of post 140 before exiting through the top of post 140 or platform 142. A similar geothermal cooling system may also be used for cooling the water for water supply 160.

Control system 148 may include an adaptive program capable of adjusting cleaning durations. The adaptive program may include a "learning" phase which maps the effect of different cleaning durations on the output of solar panels P.

For example, the program records the output of solar panels P. If the output has fallen below 80%, the program will clean solar panels P for 1 minute. After the cleaning, the program will record the output again to measure the effect of the cleaning. The next time the output falls below 80%, the program will clean solar panels P for 2 minutes, and so on.

When the adaptive program has completed this learning phase, it will have captured a relationship between cleaning duration and solar panel output. The adaptive program may then select a cleaning duration that is sufficiently long to restore a portion of the lost output, but avoids the diminishing returns of excessively long cleaning durations. Alternatively, the adaptive program may provide this data to a user to select a cleaning duration.

The adaptive program may be capable of adjusting several different parameters, such as the amount of water used, tilt angle of solar panels P, agitation variables (frequency, amplitude, and duration), and amount of energy used for cleaning The adaptive program is designed to increase the amount of output from solar panels P, while decreasing the amount of water and energy used for cleaning.

Similarly, the adaptive program may be capable of adjusting parameters related to the air cooling. The adaptive program may include a learning phase which maps the effect of air flow on the output of solar panels P. For example, the program records the output of solar panels P. If the output has fallen below 80%, the program will feed 5V to a fan which drives the cooling air. The program will continue to record the output of solar panels P to determine the effect of the cooling air on the output. When the output has reached a steady state, the program will increase the voltage to the fan, and so on.

When the adaptive program has completed this learning phase, it will have captured a relationship between fan voltage and solar panel output. The adaptive program may then select a fan voltage that avoids the diminishing returns of excessively high air flow.

The system and method for cleaning and cooling solar panels described minimizes or reduces the amount of labor and additional materials or components required. This is achieved by adapting existing components to new, additional uses. For example, main beam 120, used for providing mechanical support to solar panels P, may be adapted to provide water for cleaning and cooling, and/or air for cooling. Main beam 120 may also be adapted to provide nozzles 152 and gutters 170.

While the invention has been described in terms of some specific examples and in some specific embodiments, it will be clear that this invention is not limited to these specific examples and embodiments and that many changes and modified embodiments will be obvious to those skilled in the art without departing from the true spirit and scope of the invention as defined in the appended claims.

What is claimed is:

1. An apparatus for supporting a solar panel, the apparatus comprising:
   a main beam;
   at least one elongated member connected transversely to the main beam and supported by the main beam, the at least one elongated member being adapted to support the solar panel;
   the main beam defining a liquid channel for carrying a liquid along an interior of the main beam, the main beam having a liquid port for providing access to the liquid channel;
   a liquid supply coupled to the liquid port, the liquid supply supplying liquid to the liquid channel; and
   a nozzle coupled to the main beam in fluid communication with the liquid channel, the nozzle configured to spray the liquid on a collecting surface of the solar panel to clean and cool the solar panel.

2. The apparatus of claim 1, further comprising:
   a gutter coupled to an edge of the solar panel for reclaiming used liquid flowing off the edge of the solar panel.

3. The apparatus of claim 1, further comprising:
   a bearing coupled to an end of the main beam, the bearing allowing the main beam to rotate and the solar panel to tilt.

4. The apparatus of claim 3, wherein the liquid port is coupled to an inner race of the bearing.

5. The apparatus of claim 1, further comprising a control system programmed to initiate spraying when electrical output of the solar panel falls below a predetermined threshold.

6. The apparatus of claim 1, wherein the nozzle is configured to spray the liquid on a collecting surface of the solar panel when the solar panel is positioned for solar collection.

7. An apparatus for supporting a solar panel, the apparatus comprising:
   a main beam supporting the solar panel, wherein the main beam defines a liquid channel for carrying liquid along an interior of the main beam and a gas channel for carrying a gas along an interior of the main beam, and the main beam has a liquid port for providing access to the liquid channel and a gas port for providing access to the gas channel;
   a liquid supply coupled to the liquid port, the liquid supply supplying liquid to the liquid channel;
   a nozzle coupled to the main beam in fluid communication with the liquid channel, the nozzle configured to spray the liquid on a collecting surface of the solar panel to clean and cool the solar panel;
   a gas supply coupled to the gas port, the gas supply supplying gas to the gas channel;
   an impermeable shroud coupled to an underside of the solar panel and offset from the solar panel to define a gas passage; and
   a gas duct coupled to the main beam in fluid communication with the gas channel, the gas duct configured to direct the gas through the gas passage to cool the solar panel.

8. The apparatus of claim 7, further comprising:
   a bearing coupled to an end of the main beam, the bearing allowing the main beam to rotate and the solar panel to tilt.

9. The apparatus of claim 8, wherein the gas port is coupled to an inner race of the bearing.

10. The apparatus of claim 7, wherein the main beam further comprises a gutter for reclaiming used liquid flowing off an edge of the solar panel.

11. An apparatus for supporting a solar panel, the apparatus comprising:
   a main beam;
   at least one elongated member connected transversely to the main beam and supported by the main beam, the at least one elongated member being adapted to support the solar panel;
   the main beam defining a gas channel for carrying a gas along an interior of the main beam, the main beam having a gas port for providing access to the gas channel;
   a gas supply coupled to the gas port, the gas supply supplying gas to the gas channel;
   an impermeable shroud coupled to an underside of the solar panel and offset from the solar panel to define a gas passage; and a gas duct coupled to the main beam in fluid communication with the gas channel, the gas duct configured to direct the gas through the gas passage to cool the solar panel.

12. The apparatus of claim 11, further comprising:
a bearing coupled to an end of the main beam, the bearing allowing the main beam to rotate and the solar panel to tilt.

13. The apparatus of claim 12, wherein the gas port is coupled to an inner race of the bearing.

14. The apparatus of claim 11, further comprising a control system programmed to initiate cooling when electrical output of the solar panel falls below a predetermined threshold.

15. An apparatus for supporting a solar panel, the apparatus comprising:
a first means for supporting a second means;
the second means for supporting an underside of the solar panel,
the first means defining a liquid channel for carrying a liquid along an interior of the first means, the first means having a liquid port for providing access to the liquid channel;
a liquid supply coupled to the liquid port, the liquid supply supplying liquid to the liquid channel; and
a means for spraying coupled to the first means in fluid communication with the liquid channel, the means for spraying configured to spray the liquid on a collecting surface of the solar panel to clean and cool the solar panel.

* * * * *